United States Patent
Göbel et al.

(10) Patent No.: US 6,579,758 B2
(45) Date of Patent: Jun. 17, 2003

(54) METHOD AND INSTALLATION FOR FABRICATING ONE-SIDED BURIED STRAPS

(75) Inventors: Bernd Göbel, Dresden (DE); Martin Gutsche, Dorfen (DE); Alfred Kersch, Putzbrunn (DE); Werner Steinhögl, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,656

(22) Filed: Jul. 1, 2002

(65) Prior Publication Data

US 2003/0003652 A1 Jan. 2, 2003

(30) Foreign Application Priority Data

Jun. 29, 2001 (DE) .......................... 101 31 709

(51) Int. Cl.⁷ .......................................... H01L 21/8242
(52) U.S. Cl. ...................................................... 438/244
(58) Field of Search ................................ 438/243, 244, 438/248

(56) References Cited

U.S. PATENT DOCUMENTS

| 5,360,758 A | | 11/1994 | Bronner et al. |
|---|---|---|---|
| 5,719,080 A | | 2/1998 | Kenney |
| 5,827,765 A | * | 10/1998 | Stengl et al. ............... 438/243 |
| 5,844,266 A | * | 12/1998 | Stengl et al. ............... 257/301 |
| 6,238,967 B1 | * | 5/2001 | Shiho et al. ............... 438/244 |
| 6,426,253 B1 | * | 7/2002 | Tews et al. ............... 438/243 |
| 6,426,526 B1 | * | 7/2002 | Divakaruni et al. ........ 257/302 |
| 6,509,599 B1 | * | 1/2003 | Wurster et al. ............ 257/301 |

OTHER PUBLICATIONS

Published International Application No. 01/39248 (Benzinger et al.), dated May 31, 2001.
Published International Application No. 01/91180 (Tews et al.), dated Nov. 29, 2001.

* cited by examiner

Primary Examiner—Carl Whitehead, Jr.
Assistant Examiner—David S Blum
(74) Attorney, Agent, or Firm—Laurence A. Greenberg; Werner H. Stemer; Gregory L. Mayback (57) ABSTRACT

Buried straps are produced on one side in deep trench structures. A PVD process is used to deposit masking material in the recess inclined at an angle. As a result, a masking wedge is produced on the buried strap, on one side in the base region of the recess. The masking wedge serves as a mask during a subsequent anisotropic etching step, which is carried out selectively with respect to the masking wedge, for removing the buried strap on one side.

8 Claims, 7 Drawing Sheets

METHOD AND INSTALLATION FOR FABRICATING ONE-SIDED BURIED STRAPS

BACKGROUND OF THE INVENTION

Field of the Invention:

The invention lies in the semiconductor manufacturing and semiconductor technology fields. More specifically, the present invention relates to a method for fabricating a semiconductor structure and to a correspondingly fabricated semiconductor structure, and also to an installation for fabricating the structure and for carrying out the method.

In the context of DRAMs it is generally known to fabricate a contact on one side between a DRAM cell transistor and the storage electrode of a trench capacitor. The contact between the capacitor electrode and the source/drain region of the cell transistor is also known as a buried strap. The production of the buried strap causes particular problems in the case of a vertical transistor, especially if the corresponding memory cells cover a minimal chip area. This minimal chip area results if the cell area in units of the minimum feature size F that can be produced by lithography is selected to be minimal in accordance with the cell type. This results in high aspect ratios (>1:5) in the vertical transistor, and these ratios are additionally increased as F decreases, since the transistor length or the depth of the buried strap cannot readily be reduced.

In the case of planar transistors, the buried strap is structured by means of lithography in accordance with the prior art. In the case of the high aspect ratios of the vertical transistors which have been mentioned or similar deep trench semiconductor structures, this cannot be carried out. Inclined implantation for doping on one side also causes problems, because with the high aspect ratios that are present, there are problems with the scatter of the doping ions and their diffusion during activation.

Ronald A. Powell and Stephen Rossnagel describe a so-called long-throw PVD process in "Thin Films": PVD (Physical Vapor Deposition) for Microelectronics: Sputter Deposition applied to Semiconductor Manufacturing, Academic Press, San Diego, Calif., USA 1999, p. 191–195 as a process used in microelectronics for the deposition of diffusion barriers, such as Ti or TiN. It is customary to select a distance of approximately 30 cm between the magnetron cathode and the wafer surface.

The collimated PVD process is another known process used in microelectronics for deposition of diffusion barriers, such as Ti or TiN (Powell/Rossnagel p. 195–212). In the case of collimated PVD, atoms are bundled onto the wafer surface by the collimator, which acts as a direction filter and is formed from tubular elements arranged in an array. In theory, aspect ratios of from 0.5 to 4 are known in the literature for the collimator.

Furthermore, the I-PVD (ionized magnetron sputter deposition) process is known for the deposition of diffusion barriers, such as Ti and TiN and Ta and TaN (Powell/Rossnagel, p. 241–249). Unlike the above PVD processes, 80% of the deposited particles are ionized. They are directionally deposited on the wafer surface by action of a voltage. In that process, it is customary for the bias voltage to be applied directly to the wafer.

SUMMARY OF THE INVENTION

It is accordingly an object of the invention to provide a method and an installation for the production of buried straps on one side, which overcomes the above-mentioned disadvantages of the heretofore-known devices and methods of this general type and which enables the production of the buried straps in deep trench structures.

With the foregoing and other objects in view there is provided, in accordance with the invention, a method of fabricating a semiconductor structure, which comprises:

providing a semiconductor structure with a recess having a base, and a buried strap contact (e.g., forming a contact between a capacitor electrode and a source/drain region of a transistor in the semiconductor structure);

depositing masking material in the recess with PVD process deposition inclined at a tilting angle, to thereby form a masking wedge on the buried strap on one side in the base of the recess; and subsequently anisotropically etching, using the masking wedge as a mask, and etching selectively with respect to the masking wedge, for removing the buried strap on one side in the base of the recess.

In other words, a mask which is produced in self-aligned fashion on one side at the bottom of the trench is used for the inventive structuring of the buried strap. According to the invention, methods which are based on targeted deposition of a suitable material are used to produce the mask. The position of the mask on one side in the trench is produced by the tilting of the wafer which is to be processed by the tilting angle α with respect to the main direction of deposition. This advantageously makes use of the shadow formation in the trench structure through the targeted deposition. The lateral dimensions of the mask which is produced may be significantly smaller than the minimum feature size F which can be produced by lithography, e.g. F/2. The mask can in this case be produced without the use of an expensive lithography step. Moreover, the mask which is produced is free of alignment errors such as those which occur in lithography, since it is produced in self-aligned fashion with respect to the trench structure. According to the invention, it is possible to use modified deposition processes which have in theory long been known in silicon technology, such as modified physical vapor deposition (PVD) and ionized physical vapor deposition (I-PVD). An essential factor of each of the installations according to the invention is that the angle spread δ, i.e. the deviation from the main direction, of the deposited particles is less than ±5°, in particular less than ±2°, and that the wafer is arranged tiltable in the installation.

The method is advantageously carried out using an I-PVD installation, since a process carried out with an installation of this type in particular has a higher yield than collimated PVD or long-throw PVD. According to a preferred embodiment, a grid electrode is arranged between a magnetron plasma and the surface of the wafer, a grid voltage being applied between the grid electrode and a wafer bench. This measure means that even when the wafer or wafer bench is tilted out of the horizontal, the angle spread of the ions which are being deposited as they move from the grid electrode onto the wafer can be limited to the required value; the inclination of the wafer relative to the grid electrode has no adverse effects. A grid width of around 100 μm represents a good compromise between sufficient directing action on the part of the electrode, on the one hand, and good transmission properties with regard to the ions, on the other hand.

In accordance with an added feature of the invention, a preferred tilting angle lies between 4° and 8° relative to a vertical extent of the recess.

Preferably, the masking material is amorphous silicon (a-Si). Further, a covering layer of a material that can be etched selectively with respect to the amorphous silicon may be deposited on the base of the recess, above the buried strap, prior to depositing the amorphous silicon. The covering layer preferably comprises $SiO_2$.

In accordance with an additional feature of the invention, the masking material is alumina $Al_2O_3$.

With the above and other objects in view there is also provided, in accordance with the invention, a PVD installation for depositing a masking wedge on a wafer, comprising:

- a device for holding a wafer formed with a recess and a buried strap contact at a base of the recess;
- a device for depositing masking material in the recess at a tilting angle to form a masking wedge, the device for depositing the masking material having an angle spread of deposited particles of less than ±5°, preferably less than ±2°; and
- wherein the wafer and a deposition direction are tiltable relative to one another.

Finally, there is also provided, in accordance with the invention, a wafer having recesses, in particular having a deep trench capacitor with a vertical transistor, with buried strap contacts. The buried strap contacts are fabricated using the method as summarized above, and the buried strap contacts are therefore in each case arranged on one and the same side of the recess on the wafer.

Other features which are considered as characteristic for the invention are set forth in the appended claims.

Although the invention is illustrated and described herein as embodied in a method and installation for fabricating buried straps on one side, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
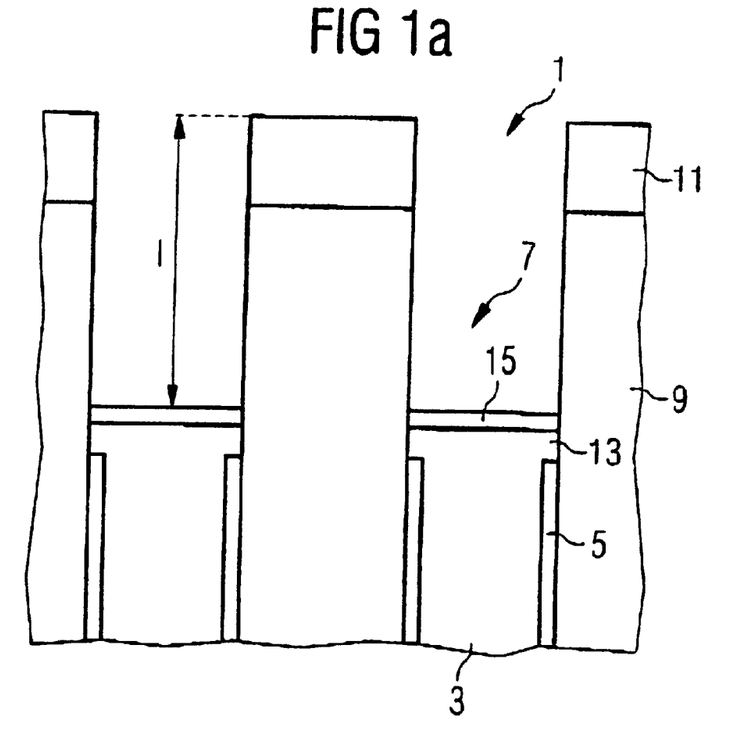
FIGS. 1a–1h are pairs of a respective diagrammatic sectional side view and a respective plan view illustrating the process of forming a deep trench capacitor, the process being performed in accordance with a first exemplary embodiment of the invention.
Figure 1B:
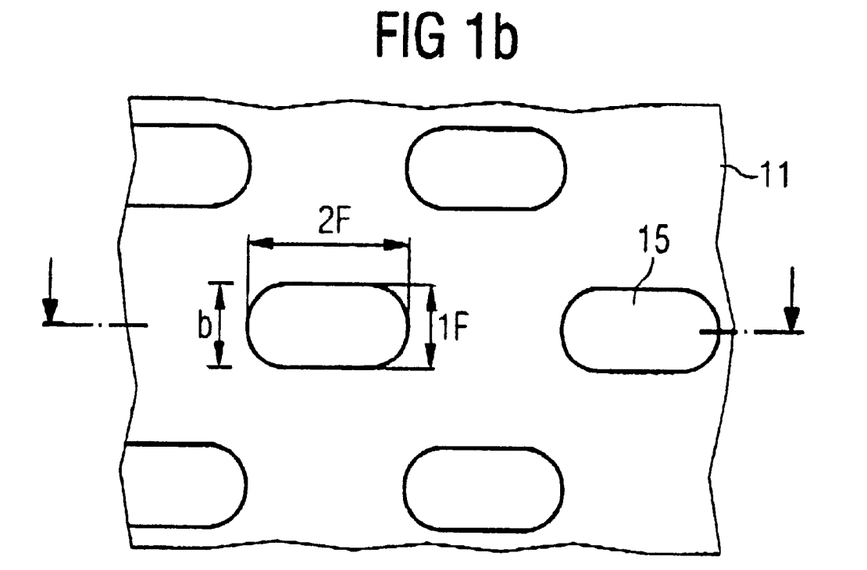

Referring now to the figures of the drawing in detail and first, particularly, to FIGS. 1a and 1b thereof, there is shown an excerpt of a wafer having a semiconductor circuit with DRAM memory cells that have undergone all the method steps, including the production of buried straps 13 for subsequently making contact between a capacitor electrode and a source/drain region of a cell transistor. FIG. 1a illustrates, as an excerpt, a sectional illustration on the section line in FIG. 1b, which shows a plan view of the wafer with numerous memory cells or recesses 7.

The deep trench (DT) capacitor 1 has a polysilicon core 3, which is surrounded by a collar oxide 5 and is arranged in the base region of a recess 7 or a trench with an elliptical base area. The recess 7 is formed in a Si substrate 9, which is covered by a thin $Si_3N_4$ mask 11. A wet-chemical isotropical etching operation has led to the collar oxide 5 being set back slightly with respect to the upper side of the polysilicon core 3, and the buried strap 13 has been produced in the form of a ring using undoped amorphous silicon in a manner which is known per se. In a subsequent process step as shown in FIGS. 1a, b, a $SiO_2$ covering layer was deposited on the base of the recess above the buried strap 13. A distance 1 from the upper side of the $Si_3N_4$ mask 11 to the upper side of the oxide covering layer 15 is in this case approximately 1 μm, and the short and long sides of the trench ellipse are b=0.2 and 0.4 μm (F=0.2 μm), and a basic area of the memory cell is $8F^2$.

Figure 1C:
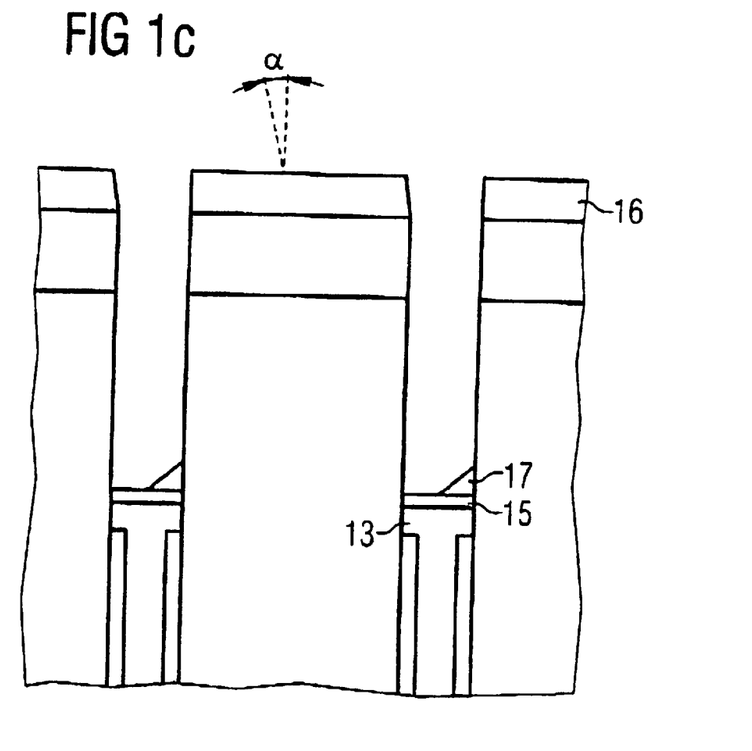
Figure 1D:
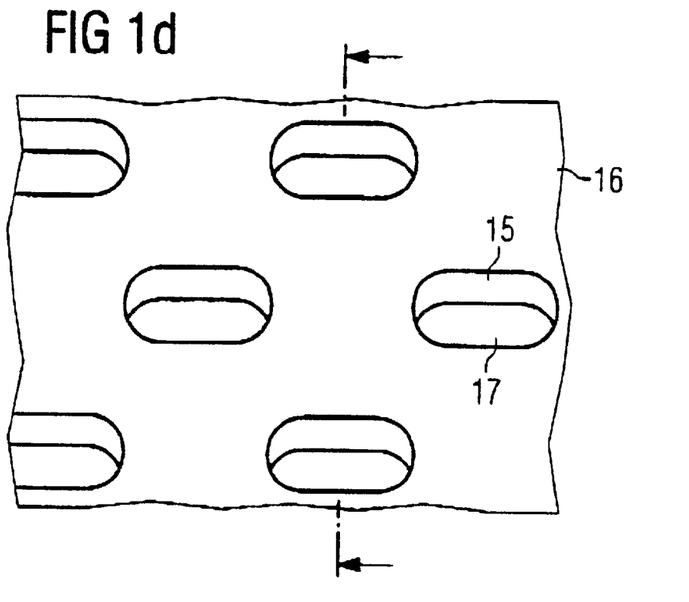

In accordance with FIGS. 1c, d, in a PVD installation which is designed in accordance with the invention described below (FIGS. 3a–c), the wafer is tilted out of the horizontal slightly, through a tilting angle α. Then, a targeted jet of deposition particles is directed onto the wafer, at the tilting angle α with respect to the normal to the recess 7. In this case, amorphous silicon (a-Si) is used as deposition material. Then, Si 16 is deposited on the $Si_3N_4$ mask 11 and in the recess 7, on one side of the DT capacitor 1, at the base and the side walls of the trench 7, whereas there is no deposition of Si in the opposite radiation shadow in the trench. In particular, in the trench 7 the Si is deposited as a masking wedge 17 on the oxide covering layer 15. As shown in FIG. 1c, the tilting angle α is selected in such a way that the $SiO_2$ covering layer 15 is covered with the masking wedge 17 over approximately half the width b of the recess 7. To avoid an extent of the masking wedge 17 which is disadvantageously too low or too expansive, the tilting angle α is therefore preferably set to be approximately α=arctan ((b/2)/1). This ensures that, despite manufacturing fluctuations and setting inaccuracies, as well as an inevitable angle spread δ, i.e. the deviation from the ideal main direction, of the deposited particles, neither too much nor too little base area is covered. It can furthermore be ensured that the angle spread δ of the deposited particles is less than 10° or ±5°, in particular less than 5°.

Therefore, according to the invention the result is a layer of amorphous silicon which covers the base of the trench 7 in the form of a wedge (FIG. 1c). The mask 17 for the subsequent anisotropic etching step (FIG. 1e) is dimensioned suitably if the base or the oxide covering layer 15 is covered to an extent of 30–70%, ideally of about 50%. To subsequently adjust the coverage of the oxide covering layer 15 and to remove the amorphous silicon at the side walls, it is possible for a suitable isotropic etching step to be carried out in a subsequent process step. To simplify the subsequent method steps, a non-illustrated nitride interface may be deposited prior to the deposition of the amorphous silicon.

Figure 1E:
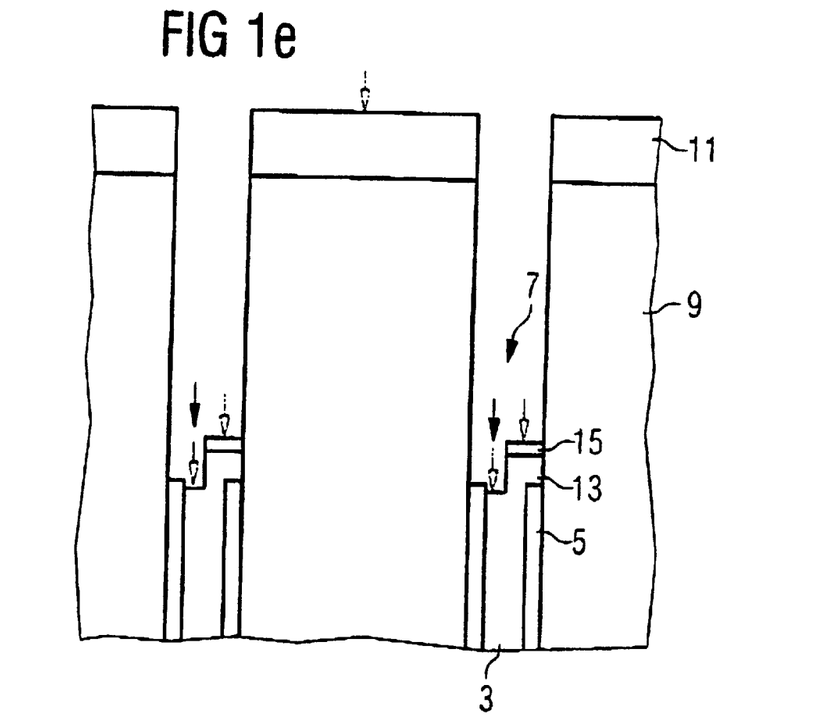
Figure 1F:
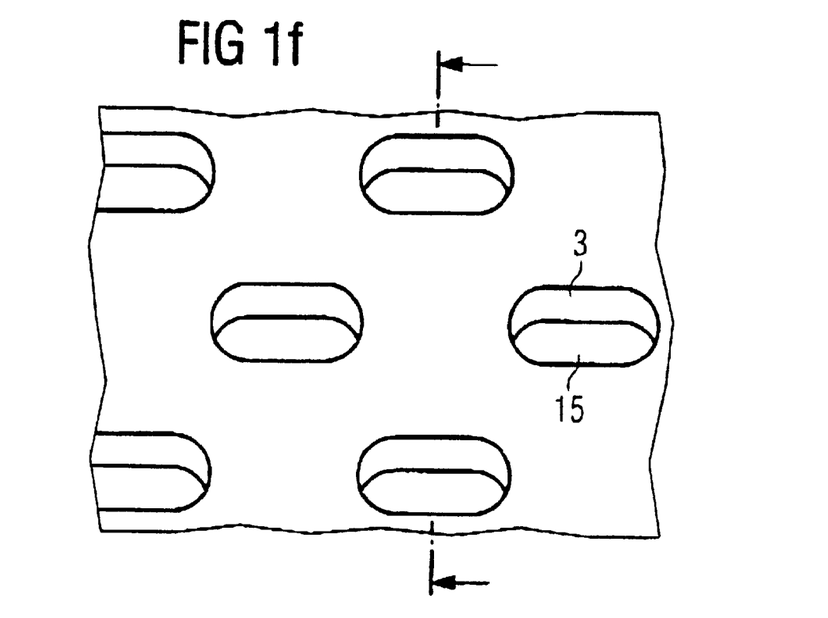

In the subsequent method steps, as shown in FIGS. 1e, f, that part of the oxide covering layer 15 which is not covered by the masking wedge 17 is removed using a highly selective anisotropic etch (arrow). Then, in a further selective anisotropic etching step (arrow in dashed lines), the a-Si (amorphous silicon) masking wedge 17 is removed above the oxide covering layer 15, and laterally adjacent thereto, the previously uncovered part of the a-Si buried strap 13 and a section of the polysilicon core 3 are removed in the region of the oxide covering layer 15 which has previously been removed. As a result, the buried strap 13 is completely removed on one side, while the collar oxide 5 remains in place, unchanged.

Figure 1G:
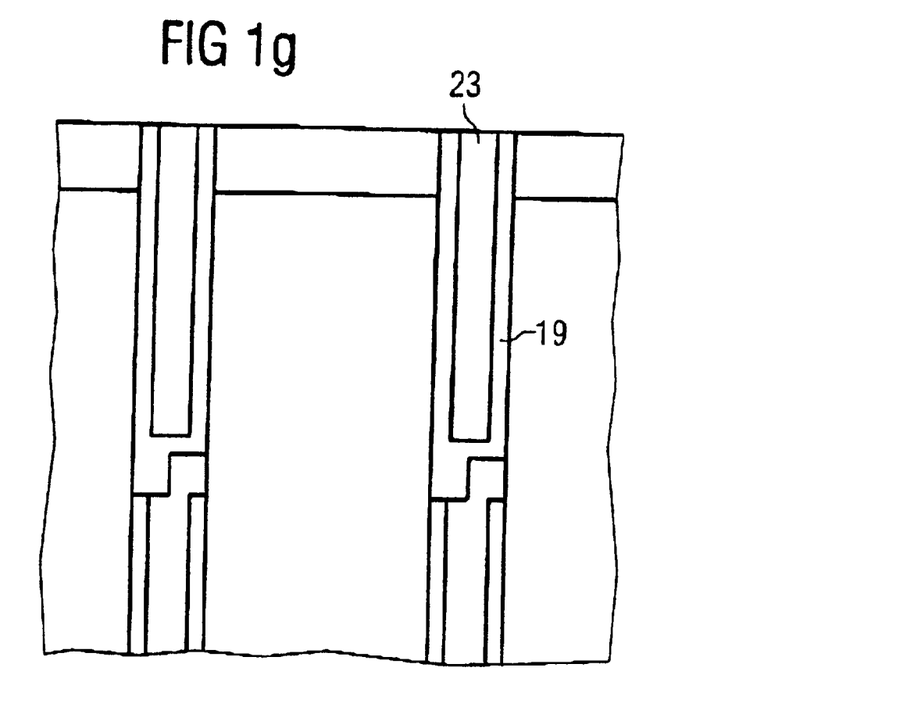
Figure 1H:
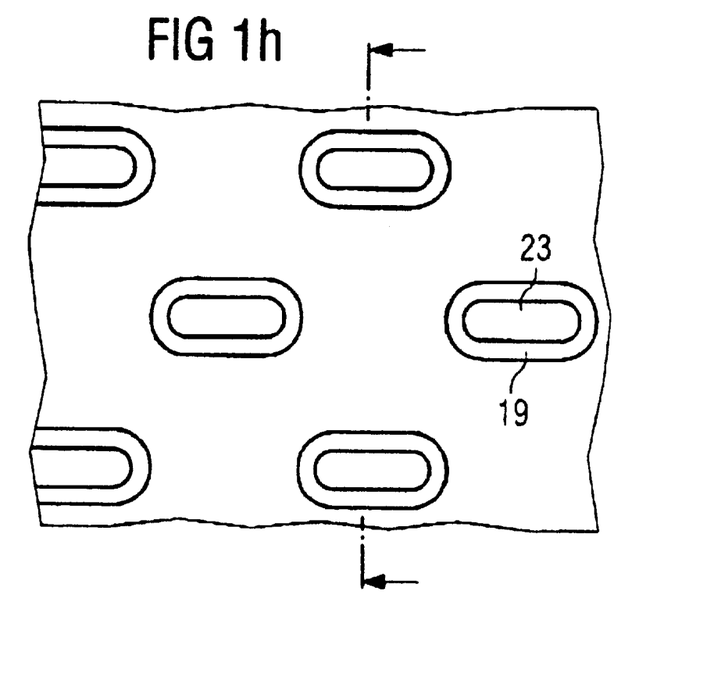

Then, the recess 7 which is present is initially filled with an oxide layer 19 by means of a TEOS process, a deep trench is produced in this layer, and this trench is filled with undoped amorphous silicon as core 23 (FIGS. 1g, h). The further process steps required for production of the desired deep trench semiconductor structure are to be carried out in accordance with the state of the art and are therefore not illustrated.

Figure 2A:
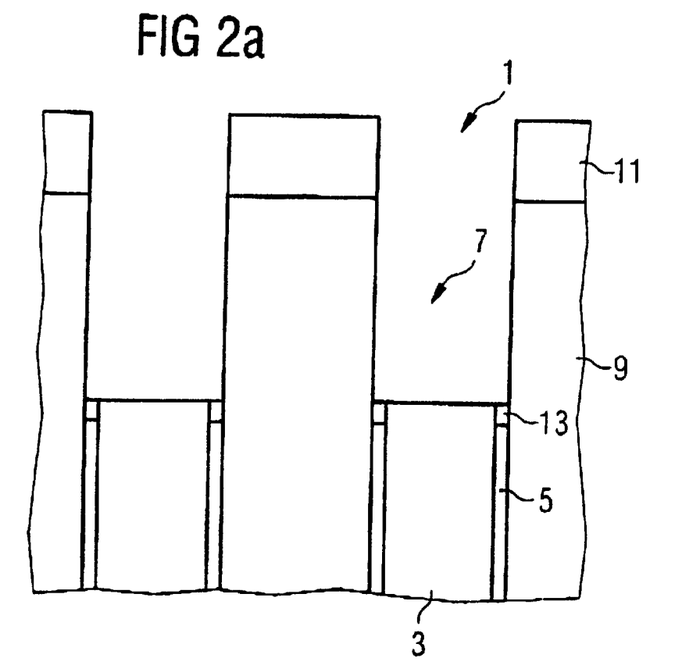
FIGS. 2a–2c are sectional side views showing excerpts of simplified illustrations of deep trench capacitors which have been processed using the method in accordance with a second exemplary embodiment.
Figure 2B:
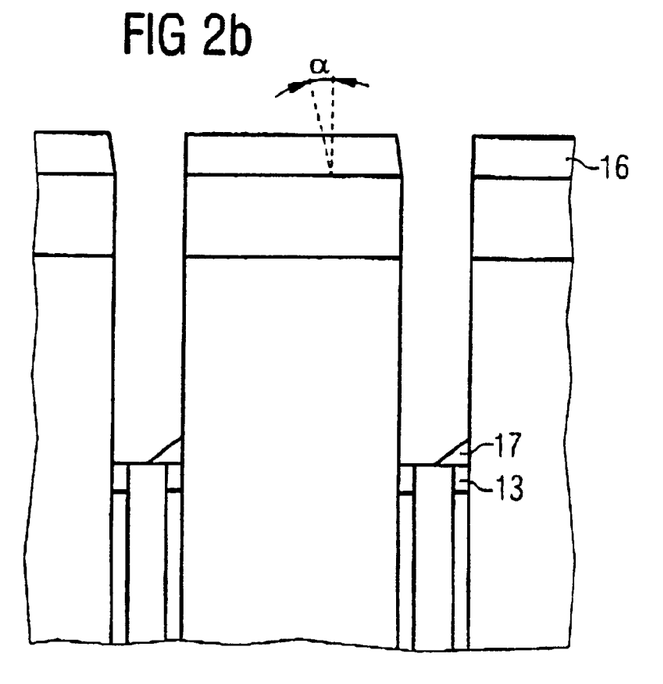
Figure 2C:
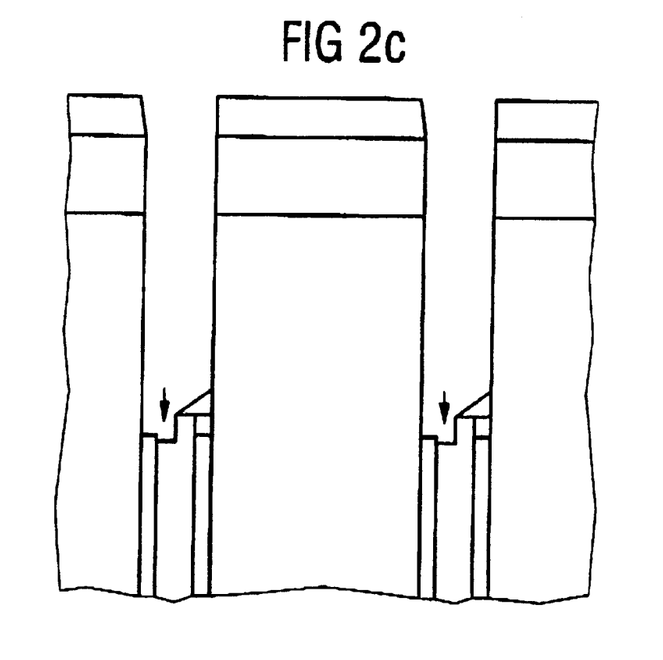

In accordance with the second exemplary embodiment (FIGS. 2a–c), as a modification to the exemplary embodiment of the method for removing the buried strap 13 on one side which is shown in FIGS. 1a–h, $Al_2O_3$ is used as material for the masking wedge 17. Therefore, in accordance with FIG. 2a, it is also possible to dispense with the deposition of the $SiO_2$ covering layer 15 in the base of the recess 7. Also, in accordance with the illustration shown in FIG. 1c, in the second exemplary embodiment, after the wafer has been tilted by the tilting angle α, the masking wedge 17 comprising $Al_2O_3$ is deposited on the trench base and the unshadowed side wall and on the entire surface of the wafer (FIG. 2b). Then, the $Al_2O_3$ layer is likewise etched back in a suitable way, as described above for the amorphous Si. In the next method step, an anisotropic and selective etching operation is used to completely remove the unmasked section of the buried strap 13 and the corresponding section of the polysilicon core 3 (FIG. 2c). Then, in a subsequent etching step, the masking wedge 17 is removed from the trench and all the other layers of $Al_2O_3$ are completely removed from the wafer (not shown).

The critical process step carried out in accordance with the invention is the production of a self-aligned mask structure comprising amorphous silicon, TiN, $Al_2O_3$ or another suitable material on one side. The following text describes three different installations and methods for implementing this process step: collimated PVD (FIG. 3a), long-throw PVD (FIG. 3b), and targeted deposition with the aid of an extended ion source or modified I-PVD (FIG. 3c).

Figure 3A:
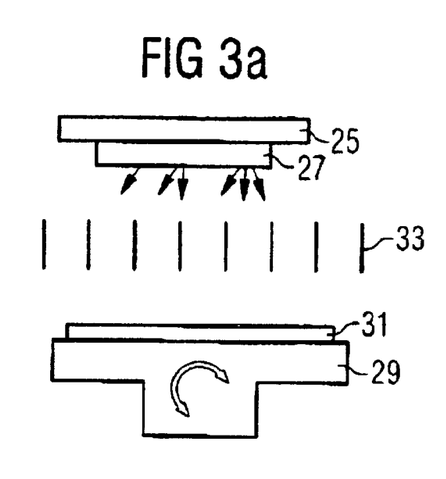
FIGS. 3a–c show highly diagrammatic illustrations of three exemplary embodiments of the PVD installations that have been modified in accordance with the invention.

With reference to FIG. 3a, the collimated PVD process can be used, for example, by using a silicon target for sputtering amorphous silicon. In a manner which is known per se, the PVD installation has in particular a magnetron cathode 25 with a sputtering target 27 and, at a distance therefrom, a wafer bench 29, on which a Si wafer 31 rests. Between them, there is a collimator 33 serving as a direction filter. To be able to achieve the structuring in accordance with the invention, a specially dimensioned collimator 33 is required. The aspect ratio—the ratio of opening diameter to length—of the collimator is 1:5, with the result that the low angle spread δ of the deposited particles of preferably 5°, which is required in accordance with the invention, is achieved; moreover, it is necessary for the wafer bench 29 to be designed so that it can be tilted through the tilting angle α in the range from approximately 4–8°.

Figure 3B:
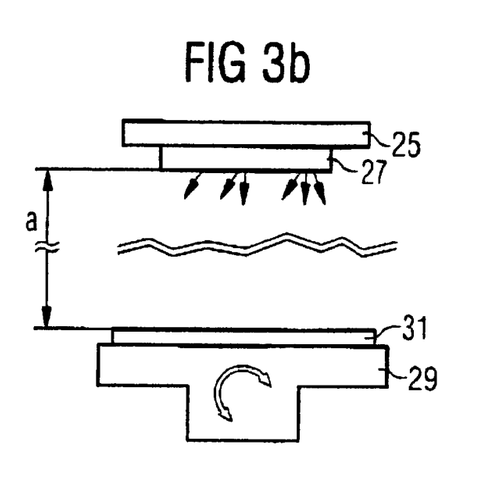

With reference to FIG. 3b, on account of the use of a silicon target, the long-throw PVD process can also be used for sputtering of amorphous Si or with other targets and corresponding atmospheres for other suitable materials. To make it possible to use the long-throw PVD installation for structuring in accordance with the invention, a greater distance a from the sputtering target 27 or the magnetron plasma to the surface of the wafer 31 than that used in the prior art is required. The distance a must be more than 2 m, so that the angle spread δ of the deposited particles of preferably 5° in accordance with the invention is achieved. Moreover, in this case too, it is necessary for the wafer bench 29 to be designed so that it can be tilted through the tilting angle α in the range from approximately 4–8°.

Figure 3C:
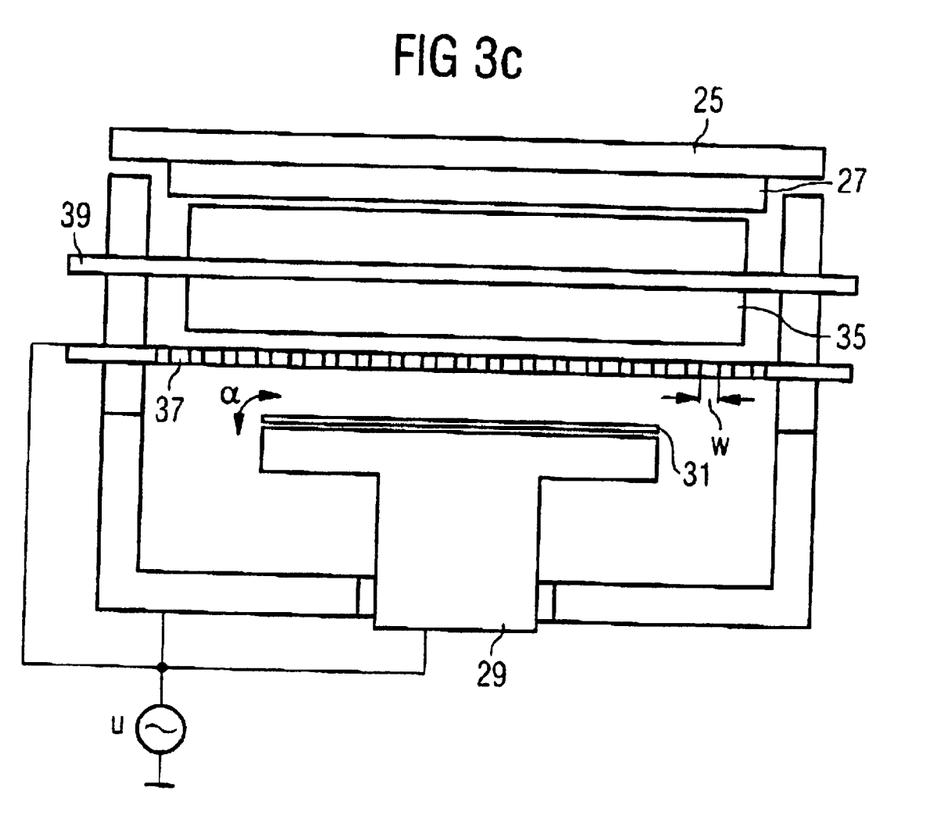

With reference to FIG. 3c, the I-PVD process can also be used for sputtering of amorphous Si or alternatively for sputtering of, for example, TiN or $Al_2O_3$. Unlike the two previous PVD processes, in the case of I-PVD 80% of the deposited particles are ionized. Therefore, for I-PVD to be used for structuring in accordance with the invention, it is necessary to arrange a grid electrode 37, which is transparent to the ions which are being deposited, to be arranged between the magnetron plasma 35 and the surface of the wafer 31. By way of example, a plate with holes or a wire mesh with a grid width w of between 10 μm and 1 mm, ideally of approximately 100 μm, is suitable. The grid electrode 37 is arranged at a distance of a few cm from the wafer surface, in order on the one hand to be as close as possible to the wafer 31, while on the other hand contact between the wafer surface and the electrode must be reliably avoided even when the wafer is tilted relative to the grid electrode 37. A bias voltage U in the range from 20–2000 V is applied to the grid electrode 37. As a result, the ions which are being deposited are accelerated forward onto the tilted wafer surface and maintain the angle spread δ, which is limited to approximately 5°, in accordance with the invention (FIG. 3c). In the region of the plasma 35, the I-PVD installation has a known ionization coil 39 with DC grounding. The wafer bench 29 is designed so that it can be tilted through the tilting angle α. In the case of I-PVD too, the ideal tilting angle α depends on the aspect ratio of the trench on whose base the mask 17 is to be structured. For an aspect ratio of the trench 7 of 1:5, values for α of between 4° and 8° also lead to good results in the I-PVD process.

We claim:

1. A method of fabricating a semiconductor structure, which comprises:

providing a semiconductor structure with a recess having a base, and a buried strap contact;

depositing masking material in the recess with PVD process deposition inclined at a tilting angle, to thereby form a masking wedge on the buried strap on one side in the base of the recess; and subsequently anisotropically etching, using the masking wedge as a mask, and etching selectively with respect to the masking wedge, for removing the buried strap on one side.

2. The method according to claim 1, wherein the buried strap forms a contact between a capacitor electrode and a source/drain region of a transistor in the semiconductor structure.

3. The method according to claim 1, which comprises adjusting an angle spread of particles deposited to form the masking wedge to less than ±5°.

4. The method according to claim 3, which comprises adjusting an angle spread to less than ±2°.

5. The method according to claim 1, which comprises adjusting the tilting angle to between substantially 4° and substantially 8° relative to a vertical extent of the recess.

6. The method according to claim 1, wherein the masking material is amorphous silicon, and the method further comprises depositing a covering layer of a material that can be etched selectively with respect to the amorphous silicon on the base of the recess, above the buried strap, prior to depositing the amorphous silicon.

7. The method according to claim 1, wherein the covering layer comprises $SiO_2$.

8. The method according to claim 1, wherein the masking material is $Al_2O_3$.

* * * * *